(12) United States Patent
Koishikawa

(10) Patent No.: US 6,613,631 B2
(45) Date of Patent: Sep. 2, 2003

(54) METHOD OF FORMING A NON-VOLATILE SEMICONDUCTOR MEMORY DEVICE WITH A TUNNEL BARRIER FILM DEFINED BY SIDE WALLS

(75) Inventor: Yukimasa Koishikawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 94 days.

(21) Appl. No.: 09/745,725

(22) Filed: Dec. 26, 2000

(65) Prior Publication Data

US 2001/0005332 A1 Jun. 28, 2001

(30) Foreign Application Priority Data

Dec. 24, 1999 (JP) .......................................... 11-367490

(51) Int. Cl.$^7$ ............................................ H01L 21/336
(52) U.S. Cl. ...................... 438/258; 438/264; 257/314; 257/317
(58) Field of Search ................................ 438/258, 264; 257/314, 317

(56) References Cited

U.S. PATENT DOCUMENTS 5,640,032 A * 6/1997 Tomioka et al. ............. 257/316
5,863,822 A * 1/1999 Kanamori et al. .......... 438/264
6,406,958 B2 * 6/2002 Kato et al. ................... 438/257
6,459,121 B1 * 10/2002 Sakamoto et al. .......... 257/315

* cited by examiner

Primary Examiner—Richard Elms
Assistant Examiner—Pho M. Luu
(74) Attorney, Agent, or Firm—Young & Thompson

(57) ABSTRACT

A tunnel barrier structure includes a first semiconductor ridged portion having a grooved first top surface; an insulating layer burying the groove, the insulating layer having a first upper surface which is higher in level than the first top surface of the first semiconductor ridged portion, the insulating layer having side walls extending upwardly from edges of the first top surface of the first semiconductor ridged portion; side wall insulating films provided on the side walls; and a tunnel insulating film provided on the first top surface of the first semiconductor ridged portion, the tunnel insulating film being defined by the side wall insulating films.

13 Claims, 22 Drawing Sheets

METHOD OF FORMING A NON-VOLATILE SEMICONDUCTOR MEMORY DEVICE WITH A TUNNEL BARRIER FILM DEFINED BY SIDE WALLS

BACKGROUND OF THE INVENTION

The present invention relates to a non-volatile semiconductor memory device and a method of forming the same, and more particularly to a non-volatile semiconductor memory device having a logic transistor region and a flash cell region isolated by a shallow trench isolation.

FIGS. 1A through 1D are fragmentary cross sectional elevation views illustrative of a conventional method of forming a conventional non-volatile semiconductor memory device having an integration of a logic transistor region and a flash cell region isolated by a shallow trench isolation.

With reference to FIG. 1A, a PAD oxide film 3 is formed over a silicon substrate 1. A stopper nitride film 4 is deposited on the PAD oxide film 3. A resist film is applied on the stopper nitride film 4. The resist film is patterned by a lithography process to form a resist pattern. A selective anisotropic etching process is carried out by use of the resist pattern as a mask to selectively etch the stopper nitride film 4, the PAD oxide film 3 and the silicon substrate 1, thereby forming shallow trench isolation grooves. Ridged portions of the silicon substrate 1 are defined by the shallow trench isolation grooves. The ridged portions of the silicon substrate 1 underlie the laminations of the PAD oxide film 3 and the stopper nitride film 4. The used resist pattern is removed. A shallow trench isolation burying oxide film 2 is deposited so that the shallow trench isolation grooves are completely buried with the shallow trench isolation burying oxide film 2, wherein the shallow trench isolation burying oxide film 2 also extends over the stopper nitride film 4.

With reference to FIG. 1B, a chemical mechanical polishing process is carried out to planarize a surface of the shallow trench isolation burying oxide film 2, whereby the top surface of the stopper nitride film 4 is exposed and slightly polished. As a result, a planarized surface is formed, wherein the top surface of the stopper nitride film 4 is leveled to the polished top surface of the shallow trench isolation burying oxide film 2, which completely buries the shallow trench isolation grooves.

With reference to FIG. 1C, the stopper nitride film 4 and the PAD oxide film 3 are etched, wherein a time of the etching process is so controlled that the top surface of the silicon substrate 1 has the same level as the etched surface of the shallow trench isolation burying oxide film 2, whereby the shallow trench isolation burying oxide film 2 becomes the shallow trench isolation 2. Further, device formation regions of the silicon substrate 1 are defined by the shallow trench isolation 2. The shallow trench isolation 2 has adjacent surface regions to the device formation regions of the silicon substrate 1, wherein divots are formed in the adjacent surface regions. Namely, the divots are formed in the shallow trench isolation 2 and are positioned in the vicinity of the device formation regions of the silicon substrate 1.

With reference to FIG. 1D, a thin oxide film is formed over the device formation regions of the silicon substrate 1 and over the shallow trench isolations 2, wherein the thin oxide film extends over the divots. The thin oxide film has variations in thickness over the divots. A conductive film is deposited over the thin oxide film. The conductive film may, for example, comprise a polysilicon film. Laminations of the conductive film and the thin oxide film are patterned to form a first lamination of a tunnel oxide film 14 and a floating gate 9 as well as a second lamination of a gate oxide film 7 and a logic gate 8, wherein the tunnel oxide film 14 and the floating gate 9 are positioned in a flash cell region 100, whilst the gate oxide film 7 and the logic gate 8 are positioned in a logic transistor region 200. A dielectric film 10 is formed on the surface of the floating gate 9. A control gate 11 is formed on the dielectric film 10 to form a flash cell in the flash cell region 100. Further, source and drain regions are selectively formed in the device formation region of the silicon substrate 1, whereby a logic transistor is formed in the logic transistor region 200. The sequence of formation of the flash cell and the logic transistor may be optional.

The gate insulation film 7 of the logic transistor in the logic transistor region 200 has variations in thickness over the divots. The tunnel oxide film 14 of the flash cell in the flash cell region 100 also has variations 15 in thickness over the divots. The thickness of the tunnel oxide film 14 defines a width of a tunnel barrier, which further defines a threshold voltage of the flash memory. The variation in thickness of the tunnel oxide film 14 causes variation in threshold voltage of the flash memory, whereby the reliability of the flash memory is deteriorated.

In the above circumstances, it had been required to develop a novel non-volatile semiconductor memory device free from the above problem.

SUMMARY OF THE INVENTION

Accordingly, it is an object of the present invention to provide a novel non-volatile semiconductor memory device free from the above problems.

It is a further object of the present invention to provide a novel non-volatile semiconductor memory device having an integration of a logic transistor region and a flash cell region isolated by a shallow trench isolation, wherein a tunnel barrier film has a uniform thickness.

It is a still further object of the present invention to provide a novel non-volatile semiconductor memory device having an integration of a logic transistor region and a flash cell region isolated by a shallow trench isolation, wherein a tunnel barrier film does not extend over divots formed in shallow trench isolations adjacent to a device formation region in the flash cell region.

It is yet a further object of the present invention to provide a novel non-volatile semiconductor memory device having an integration of a logic transistor region and a flash cell region isolated by a shallow trench isolation, wherein the flash cell is free from variation in threshold voltage.

It is yet a further object of the present invention to provide a novel non-volatile semiconductor memory device having an integration of a logic transistor region and a flash cell region isolated by a shallow trench isolation, wherein the flash cell is free from deterioration of reliability.

It is another object of the present invention to provide a novel method of forming a non-volatile semiconductor memory device free from the above problems.

It is a further object of the present invention to provide a novel method of forming a non-volatile semiconductor memory device having an integration of a logic transistor region and a flash cell region isolated by a shallow trench isolation, wherein a tunnel barrier film has a uniform thickness.

It is a still further object of the present invention to provide a novel method of forming a non-volatile semiconductor memory device having an integration of a logic transistor region and a flash cell region isolated by a shallow trench isolation, wherein a tunnel barrier film does not extend over divots formed in shallow trench isolations adjacent to a device formation region in the flash cell region.

It is yet a further object of the present invention to provide a novel method of forming a non-volatile semiconductor memory device having an integration of a logic transistor region and a flash cell region isolated by a shallow trench isolation, wherein the flash cell is free from variation in threshold voltage.

It is yet a further object of the present invention to provide a novel method of forming a non-volatile semiconductor memory device having an integration of a logic transistor region and a flash cell region isolated by a shallow trench isolation, wherein the flash cell is free from deterioration of reliability.

The present invention provides a tunnel barrier structure comprising: a first semiconductor ridged portion having a first top surface, the first semiconductor ridged portion being defined by a groove; an insulating layer burying the groove, the insulating layer having a first upper surface which is higher in level than the first top surface of the first semiconductor ridged portion, the insulating layer having side walls extending upwardly from edges of the first top surface of the first semiconductor ridged portion; side wall insulating films provided on the side walls; and a tunnel insulating film provided on the first top surface of the first semiconductor ridged portion, the tunnel insulating film being defined by the side wall insulating films.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
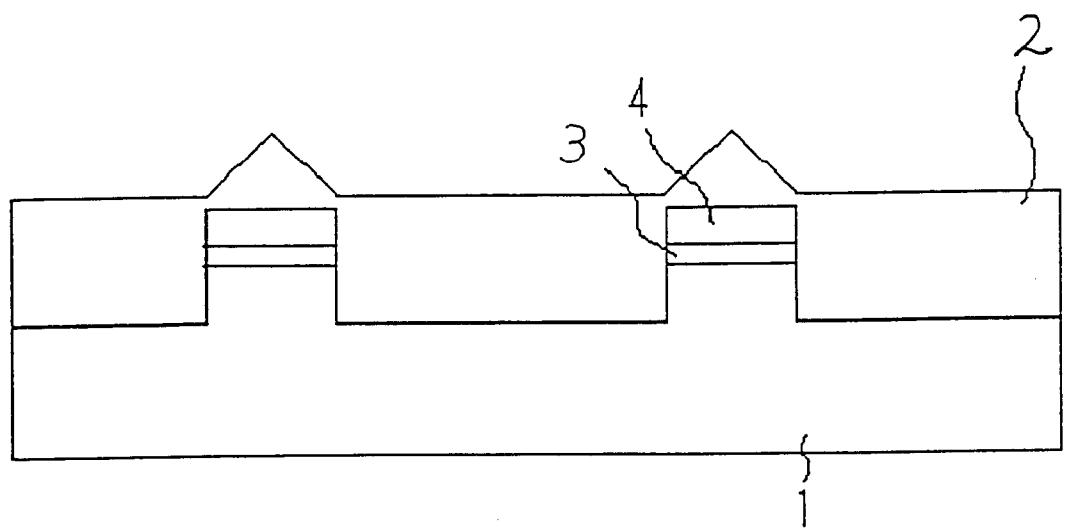
FIGS. 1A through 1D are fragmentary cross sectional elevation views illustrative of a conventional method of forming a conventional non-volatile semiconductor memory device having an integration of a logic transistor region and a flash cell region isolated by a shallow trench isolation.
Figure 1B:
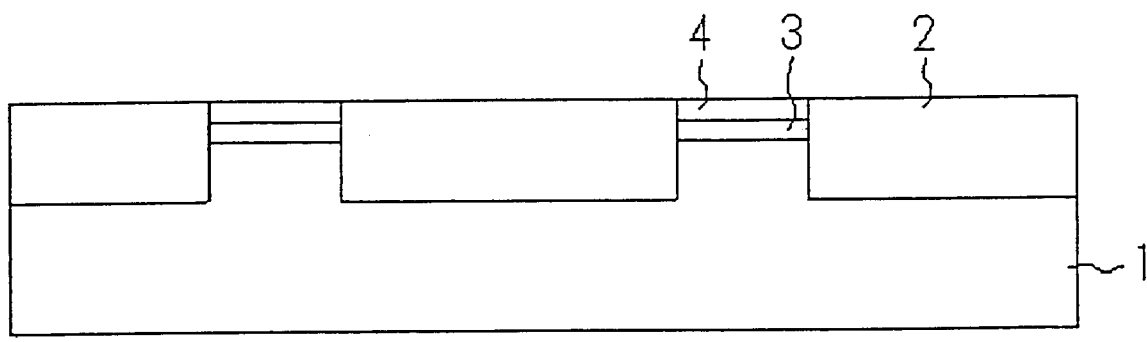
Figure 1C:
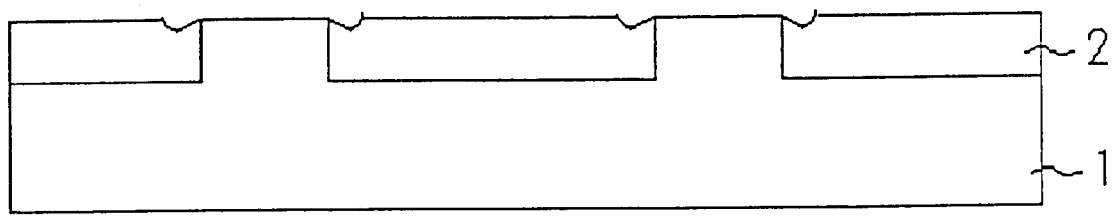
Figure 1D:
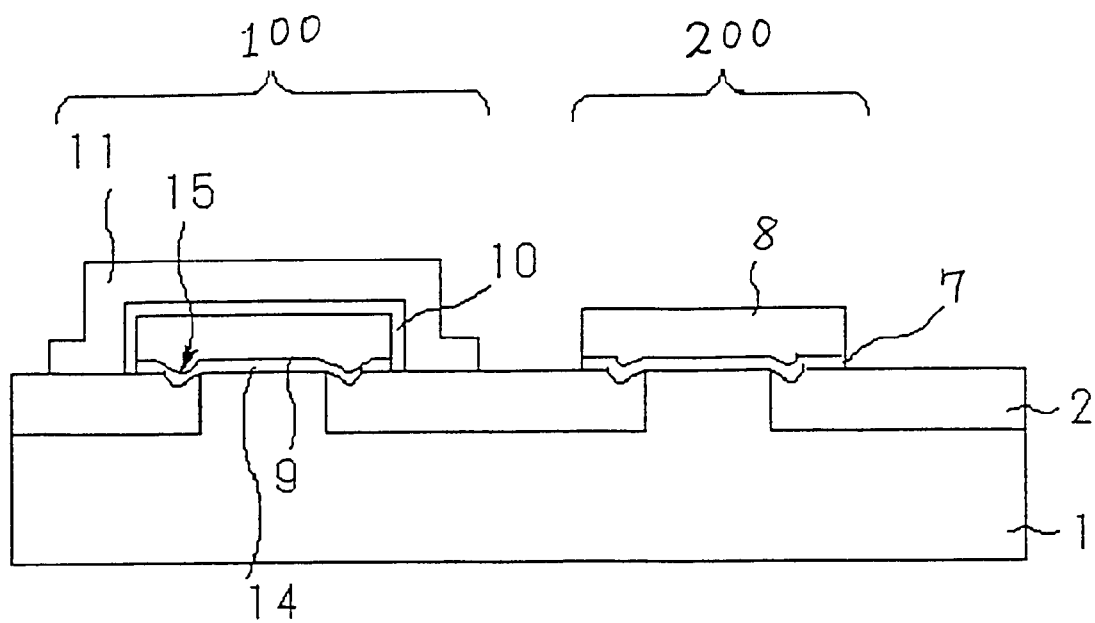

The first present invention provides a tunnel barrier structure comprising: a first semiconductor ridged portion having a first top surface, the first semiconductor ridged portion being defined by a groove; an insulating layer burying the groove, the insulating layer having a first upper surface which is higher in level than the first top surface of the first semiconductor ridged portion, the insulating layer having side walls extending upwardly from edges of the first top surface of the first semiconductor ridged portion; side wall insulating films provided on the side walls; and a tunnel insulating film provided on the first top surface of the first semiconductor ridged portion, the tunnel insulating film being defined by the side wall insulating films.

It is preferable that the tunnel insulating film comprises an oxide film.

It is also preferable that the groove comprises a shallow trench groove, and the insulating layer comprises a shallow trench isolation burying the shallow trench groove.

It is also preferable that the side walls are isotropically etched side walls.

The second present invention provides a non-volatile semiconductor memory cell structure comprising: a semiconductor substrate having a first semiconductor ridged portion having a first top surface, the first semiconductor ridged portion being defined by a groove formed in the semiconductor substrate; an insulating layer burying the groove, the insulating layer having a first upper surface which is higher in level than the first top surface of the first semiconductor ridged portion, the insulating layer having side walls extending upwardly from edges of the first top surface of the first semiconductor ridged portion; side wall insulating films provided on the side walls; a tunnel insulating film provided on the first top surface of the first semiconductor ridged portion, the tunnel insulating film being defined by the side wall insulating films; a floating gate electrode extending over the tunnel insulating film and the side wall insulating films; a dielectric film extending on a surface of the floating gate electrode; and a control gate electrode provided on the dielectric film.

It is also preferable that the tunnel insulating film comprises an oxide film.

It is also preferable that the groove comprises a shallow trench groove, and the insulating layer comprises a shallow trench isolation burying the shallow trench groove.

It is preferable that the side walls are isotropically etched side walls.

The third present invention provides a non-volatile semiconductor memory device having an integration of a non-volatile memory cell region and a logic transistor region, and the non-volatile semiconductor memory device comprises: a semiconductor substrate having a first semiconductor ridged portion having a first top surface in the non-volatile memory cell region, the first semiconductor ridged portion being defined by a groove formed in the semiconductor substrate, the semiconductor substrate having a second semiconductor ridged portion having a second top surface in the logic transistor region, the first and second top surfaces of the first and second semiconductor ridged portions having the same level as each other; an insulating layer burying the groove, the insulating layer having a first upper surface in the non-volatile memory cell region, the first upper surface being higher in level than the first and second top surfaces of the first and second semiconductor ridged portions, the insulating layer in the non-volatile memory cell region having side walls extending upwardly from edges of the first top surface of the first semiconductor ridged portion, the insulating layer having a second upper surface in the logic transistor region, the second upper surface being equal in level to the first and second top surfaces of the first and second semiconductor ridged portions and also being lower in level than the first upper surface; side wall insulating films provided on the side walls in the non-volatile memory cell region; a tunnel insulating film provided on the first top surface of the first semiconductor ridged portion, the tunnel insulating film being defined by the side wall insulating films; a floating gate electrode extending over the tunnel insulating film and the side wall insulating films; a dielectric film extending on a surface of the floating gate electrode; a control gate electrode provided on the dielectric film; a gate insulating film provided on the second top surface of the second semiconductor ridged portion; and a logic gate electrode provided on the gate insulating film.

It is preferable that the first and second upper surfaces being bounded by a step at a boundary between the non-volatile memory cell region and the logic transistor region.

It is also preferable that the tunnel insulating film comprises an oxide film.

It is also preferable that the groove comprises a shallow trench groove, and the insulating layer comprises a shallow trench isolation burying the shallow trench groove.

It is also preferable that the side walls are isotropically etched side walls.

The fourth present invention provides a method of forming a tunnel barrier structure comprising the steps of: forming an insulating layer burying a groove in a semiconductor substrate, wherein the groove defines a first semiconductor ridged portion having a first top surface of the semiconductor substrate, the insulating layer has a first upper surface which is higher in level than the first top surface of the first semiconductor ridged portion, and the insulating layer has side walls extending upwardly from edges of the first top surface of the first semiconductor ridged portion; selectively forming side wall insulating films on the side walls; and forming a tunnel insulating film on the first top surface of the first semiconductor ridged portion, wherein the tunnel insulating film is defined by the side wall insulating films.

It is preferable that the first step of forming the insulating layer further comprises the steps of: forming an oxide film over the semiconductor substrate; forming a stopper nitride film over the oxide film; selectively etching the oxide film, the stopper nitride film and the semiconductor substrate to form a groove which defines the first semiconductor ridged portion and overlying laminations of the oxide film and the stopper nitride film; depositing the insulating layer which burying the groove and extending over the overlying laminations; planarizing the insulating layer so as to form a planarized top surface of the insulation layer which is leveled to top surfaces of the overlying laminations; and carrying out an isotropic etching to etch the overlying laminations, whereby the side walls of the insulation layer are also etched.

It is preferable that the groove comprises a shallow trench groove, and the insulating layer comprises a shallow trench isolation burying the shallow trench groove.

The fifth present invention provides a method of forming a non-volatile semiconductor memory cell structure comprising the steps of: forming an insulating layer burying a groove in a semiconductor substrate, wherein the groove defines a first semiconductor ridged portion having a first top surface of the semiconductor substrate, the insulating layer has a first upper surface which is higher in level than the first top surface of the first semiconductor ridged portion, and the insulating layer has side walls extending upwardly from edges of the first top surface of the first semiconductor ridged portion; selectively forming side wall insulating films on the side walls; and forming a tunnel insulating film on the first top surface of the first semiconductor ridged portion, wherein the tunnel insulating film is defined by the side wall insulating films; forming a floating gate electrode extending over the tunnel insulating film and the side wall insulating films; forming a dielectric film extending on a surface of the floating gate electrode; and forming a control gate electrode provided on the dielectric film.

It is preferable that the first step of forming the insulating layer further comprises the steps of: forming an oxide film over the semiconductor substrate; forming a stopper nitride film over the oxide film; selectively etching the oxide film, the stopper nitride film and the semiconductor substrate to form a groove which defines the first semiconductor ridged portion and overlying laminations of the oxide film and the stopper nitride film; depositing the insulating layer which burying the groove and extending over the overlying laminations; planarizing the insulating layer so as to form a planarized top surface of the insulation layer which is leveled to top surfaces of the overlying laminations; and carrying out an isotropic etching to etch the overlying laminations, whereby the side walls of the insulation layer are also etched.

It is preferable that the groove comprises a shallow trench groove, and the insulating layer comprises a shallow trench isolation burying the shallow trench groove.

The sixth present invention provides a method of forming a non-volatile semiconductor memory device having an integration of a non-volatile memory cell region and a logic transistor region, the method comprising the steps of: forming an insulating layer burying a groove in a semiconductor substrate, wherein the groove defines a first semiconductor ridged portion having a first top surface of the semiconductor substrate and a second semiconductor ridged portion having a second top surface of the semiconductor substrate, the insulating layer has an upper surface which is higher in level than the first and second top surfaces of the first and second semiconductor ridged portions, and the insulating layer has first side walls extending upwardly from edges of the first top surface of the first semiconductor ridged portion and also has second side walls extending upwardly from edges of the second top surface of the second semiconductor ridged portion; selectively forming first side wall insulating films on the first side walls and second side wall insulating films on the second side walls; selectively forming a resist film on the non-volatile memory cell region; selectively etching the insulating layer only in the logic transistor region to form first and second upper surfaces of the insulating layer, wherein the first upper surface extends in the non-volatile memory cell region and the second upper surface extends in the logic transistor region, and the first upper surface is higher in level than the first and second top surfaces of the first and second semiconductor ridged portions, and the second upper surface is equal in level to the first and second top surfaces of the first and second semiconductor ridged portions and is lower in level than the first upper surface, and the first and second upper surfaces are bounded by a step at a boundary between the non-volatile memory cell region and the logic transistor region, and the second side wall oxide films are removed; removing the resist film; forming a non-volatile memory cell in the non-volatile memory cell region and a logic transistor in the logic transistor region, wherein the non-volatile memory cell is formed by the following steps of: forming a tunnel insulating film on the first top surface of the first semiconductor ridged portion, wherein the tunnel insulating film is defined by the side wall insulating films; forming a floating gate electrode extending over the tunnel insulating film and the side wall insulating films; forming a dielectric film extending on a surface of the floating gate electrode; and forming a control gate electrode provided on the dielectric film, and wherein the logic transistor is formed by the steps of: forming a gate insulating film over the second top surface of the second semiconductor ridged portion; and forming a logic gate on the gate insulating film.

It is preferable that the first step of forming the insulating layer further comprises the steps of: forming an oxide film over the semiconductor substrate; forming a stopper nitride film over the oxide film; selectively etching the oxide film, the stopper nitride film and the semiconductor substrate to form a groove which defines the first and second semiconductor ridged portions and overlying laminations of the oxide film and the stopper nitride film; depositing the insulating layer which burying the groove and extending over the overlying laminations; planarizing the insulating layer so as to form a planarized top surface of the insulation layer which is leveled to top surfaces of the overlying laminations; and carrying out an isotropic etching to etch the overlying laminations, whereby the first and second side walls of the insulation layer are also etched.

It is preferable that the groove comprises a shallow trench groove, and the insulating layer comprises a shallow trench isolation burying the shallow trench groove.

The seventh present provides a method of forming a non-volatile semiconductor memory device having an integration of a non-volatile memory cell region and a logic transistor region. The method comprise the steps of: forming an insulating layer burying a groove in a semiconductor substrate, wherein the groove defines a first semiconductor ridged portion having a first top surface of the semiconductor substrate and a second semiconductor ridged portion having a second top surface of the semiconductor substrate, the insulating layer has an upper surface which is higher in level than the first and second top surfaces of the first and second semiconductor ridged portions, and the insulating layer has first side walls extending upwardly from edges of the first top surface of the first semiconductor ridged portion and also has second side walls extending upwardly from edges of the second top surface of the second semiconductor ridged portion; selectively forming a resist film on the non-volatile memory cell region; selectively etching the insulating layer only in the logic transistor region to form first and second upper surfaces of the insulating layer, wherein the first upper surface extends in the non-volatile memory cell region and the second upper surface extends in the logic transistor region, and the first upper surface is higher in level than the first and second top surfaces of the first and second semiconductor ridged portions, and the second upper surface is equal in level to the first and second top surfaces of the first and second semiconductor ridged portions and is lower in level than the first upper surface, and the first and second upper surfaces are bounded by a step at a boundary between the non-volatile memory cell region and the logic transistor region, and the second side walls are removed; removing the resist film; selectively forming first side wall insulating films on the first side walls; forming a non-volatile memory cell in the non-volatile memory cell region and a logic transistor in the logic transistor region, wherein the non-volatile memory cell is formed by the following steps of: forming a tunnel insulating film on the first top surface of the first semiconductor ridged portion, wherein the tunnel insulating film is defined by the side wall insulating films; forming a floating gate electrode extending over the tunnel insulating film and the side wall insulating films; forming a dielectric film extending on a surface of the floating gate electrode; and forming a control gate electrode provided on the dielectric film, and wherein the logic transistor is formed by the steps of: forming a gate insulating film over the second top surface of the second semiconductor ridged portion; and forming a logic gate on the gate insulating film.

It is preferable that the first step of forming the insulating layer further comprises the steps of: forming an oxide film over the semiconductor substrate; forming a stopper nitride film over the oxide film; selectively etching the oxide film, the stopper nitride film and the semiconductor substrate to form a groove which defines the first and second semiconductor ridged portions and overlying laminations of the oxide film and the stopper nitride film; depositing the insulating layer which burying the groove and extending over the overlying laminations planarizing the insulating layer so as to form a planarized top surface of the insulation layer which is leveled to top surfaces of the overlying laminations; and carrying out an isotropic etching to etch the overlying laminations, whereby the first and second side walls of the insulation layer are also etched.

It is preferable that the groove comprises a shallow trench groove, and the insulating layer comprises a shallow trench isolation burying the shallow trench groove.

PREFERRED EMBODIMENT

First Embodiment

Figure 2:
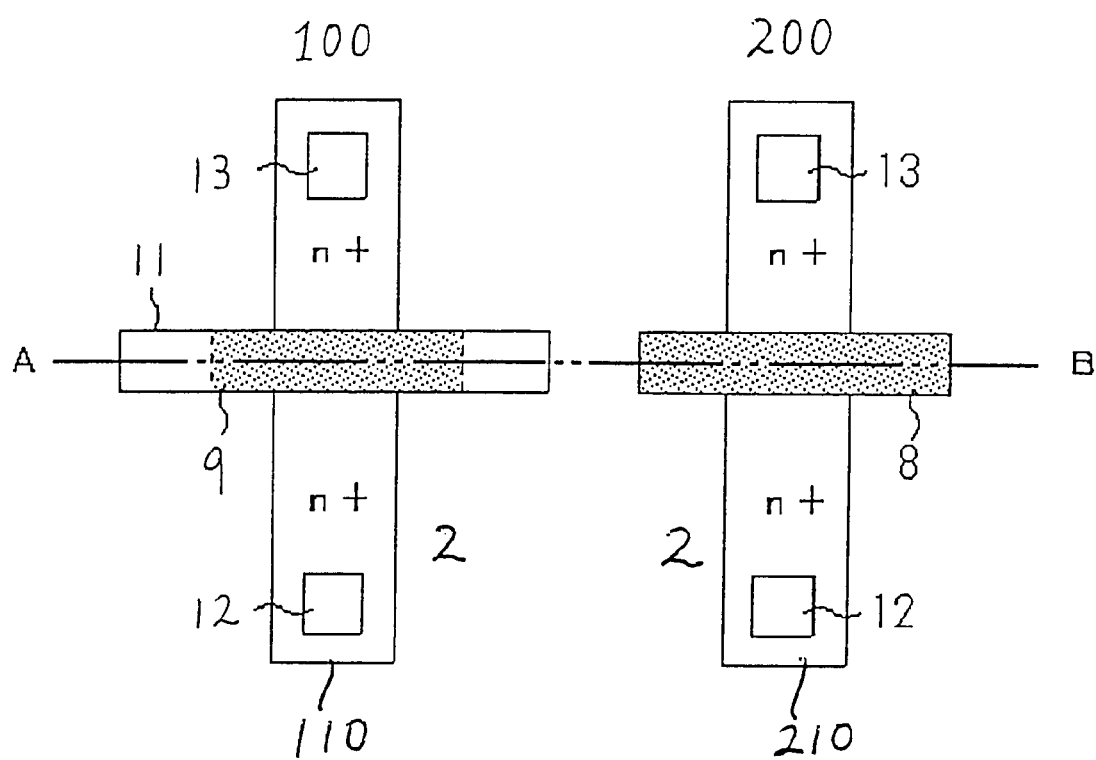
FIG. 2 is a fragmentary plane view illustrative of a novel non-volatile semiconductor memory device having an integration of a flash cell region and a logic transistor region in accordance with the present invention.

A first embodiment according to the present invention will be described in detail with reference to the drawings. FIG. 2 is a fragmentary plane view illustrative of a novel non-volatile semiconductor memory device having an integration of a flash cell region and a logic transistor region in accordance with the present invention. The novel non-volatile semiconductor memory device has an integration of a flash cell region 100 and a logic transistor region 200. The flash cell region 100 has a control gate 11, a dielectric film not illustrated, and a floating gate 9. The control gate 11 and the floating gate 9 have stripe shapes having a longitudinal direction along a first lateral direction. The flash cell region 100 also has a first device formation region 110 of a semiconductor substrate. The first device formation region 110 has a stripe shape having a longitudinal direction along a second lateral direction perpendicular to a first lateral direction. The first device formation region 110 is surrounded and defined by a shallow trench isolation 2. The first device formation region 110 comprises an n+-type region. The first device formation region 110 has a drain contact 12, which is distanced from the floating gate 9 and the control gate 11 in the second lateral direction. The first device formation region 110 also has a source contact 13, which is distanced from the floating gate 9 and the control gate 11 in the second lateral direction. The drain contact 12 and the source contact 13 are positioned in opposite sides of the floating gate 9 and the control gate 11. The logic transistor region 200 has a logic gate 8, and a gate insulation film not illustrated. The logic gate 8 has a stripe shape having a longitudinal direction along the first lateral direction. The logic transistor region 200 also has a second device formation region 210 of the semiconductor substrate. The second device formation region 210 has a stripe shape having a longitudinal direction along the second lateral direction perpendicular to the first lateral direction. The second device formation region 210 is surrounded and defined by the shallow trench isolation 2. The second device formation region 210 comprises an n+-type region. The second device formation region 210 has a drain contact 12, which is distanced from the logic gate 8 in the second lateral direction. The second device formation region 210 also has a source contact 13, which is distanced from the logic gate 8 in the second lateral direction. The drain contact 12 and the source contact 13 are positioned in opposite sides of the logic gate 8.

Figure 3:
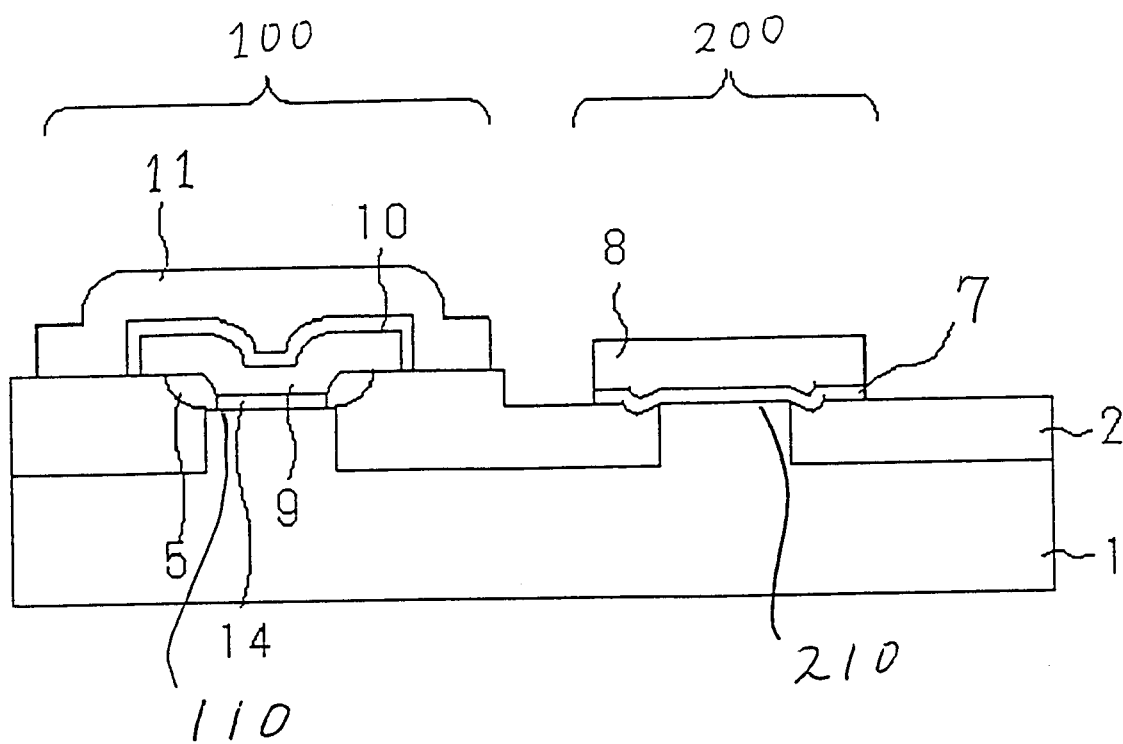
FIG. 3 is a fragmentary cross sectional elevation view illustrative of a novel non-volatile semiconductor memory device having an integration of a logic transistor region and a flash cell region isolated by a shallow trench isolation, taken along an A-B line of FIG. 2, in a first embodiment in accordance with the present invention.

FIG. 3 is a fragmentary cross sectional elevation view illustrative of a novel non-volatile semiconductor memory device having an integration of a logic transistor region and a flash cell region isolated by a shallow trench isolation, taken along an A-B line of FIG. 2, in a first embodiment in accordance with the present invention.

A novel non-volatile semiconductor memory device has a flash cell region 100 and a logic transistor region 200. The novel non-volatile semiconductor memory device is formed over a silicon substrate 1. The silicon substrate 1 has a first ridged portion in the flash cell region 100 and a second ridged portion in the logic transistor region 200. The top surfaces of the first ridged portion and the second ridged portion have the same level as each other. A first device formation region 110 comprises the top surface of the first ridged portion of the silicon transistor 1. A second deice formation region 210 comprises the top surface of the second ridged portion of the silicon transistor 1. The first ridged portion and the second ridged portion are defined by shallow trench grooves, which are buried with a shallow trench isolation oxide film 2. The shallow trench isolation oxide film 2 has a first upper surface in the flash cell region 100, wherein the first upper surface is higher in level than the top surfaces of the first and second ridged portions of the silicon substrate 1. The shallow trench isolation oxide film 2 has a second upper surface in the logic transistor region 200, wherein the second upper surface is lower in level than the first upper surface in the flash cell region 100, and the second upper surface is the same in level as the top surfaces of the first and second ridged portions of the silicon substrate 1. The first and second upper surfaces of the shallow trench isolation oxide film 2 are bounded by a step at a boundary between the flash cell region 100 and the logic transistor region 200. Since the first upper surface is higher in level than the top surface of the first ridged portion of the silicon substrate 1, side walls of the shallow trench isolation oxide film 2 are formed, which extend from the to surface of the first ridged portion of the silicon substrate 1. Side wall oxide films 5 are selectively provided on the side walls of the shallow trench isolation oxide film 2 adjacent to the first device formation region comprising the top surface of the first ridged portion of the silicon substrate 1. A tunnel oxide film 14 is provided on the first device formation region 110 comprising the top surface of the first ridged portion of the silicon substrate 1. The tunnel oxide film 14 is defined by the side wall oxide films 5. Since the tunnel oxide film 14 selectively extends over only the first device formation region 110 free of any divot, for which reason the tunnel oxide film 14 has a uniform thickness. A floating gate electrode 9 is selectively provided over the tunnel oxide film 14, the side wall oxide films 5 and adjacent parts of the top surface of the shallow trench isolation burying oxide film 2 to the side wall oxide films 5. A dielectric film 10 is provided on a surface of the floating gate electrode 9. A control gate electrode 11 is provided on a surface of the dielectric film 10. A flash memory cell is formed in the flash cell region 100. A gate insulation film 7 is provided over the second device formation region 210 comprising the top surface of the second ridged portion of the silicon substrate 1 and also over adjacent parts having divots of the top surface of the shallow trench isolation burying oxide film 2. A logic gate 7 is provided on the gate insulation film 7. The logic transistor is provided in the logic transistor region 200.

As described above, the gate insulation film 7 of the logic transistor in the logic transistor region 200 has variations in thickness over the divots. Notwithstanding, the tunnel oxide film 14 of the flash cell in the flash cell region 100 does not extend over any divots, for which reason the tunnel oxide film 14 is uniform in thickness. The thickness of the tunnel oxide film 14 defines a width of a tunnel barrier, which further defines a threshold voltage of the flash memory. The uniformity in thickness of the tunnel oxide film 14 causes no variation in threshold voltage of the flash memory, whereby the high reliability of the flash memory is improved.

FIGS. 4A through 4G are fragmentary cross sectional elevation views illustrative of a novel method of forming a novel non-volatile semiconductor memory device having an integration of a logic transistor region and a flash cell region isolated by a shallow trench isolation, taken along an A-B line of FIG. 2, in a first embodiment in accordance with the present invention.

Figure 4A:
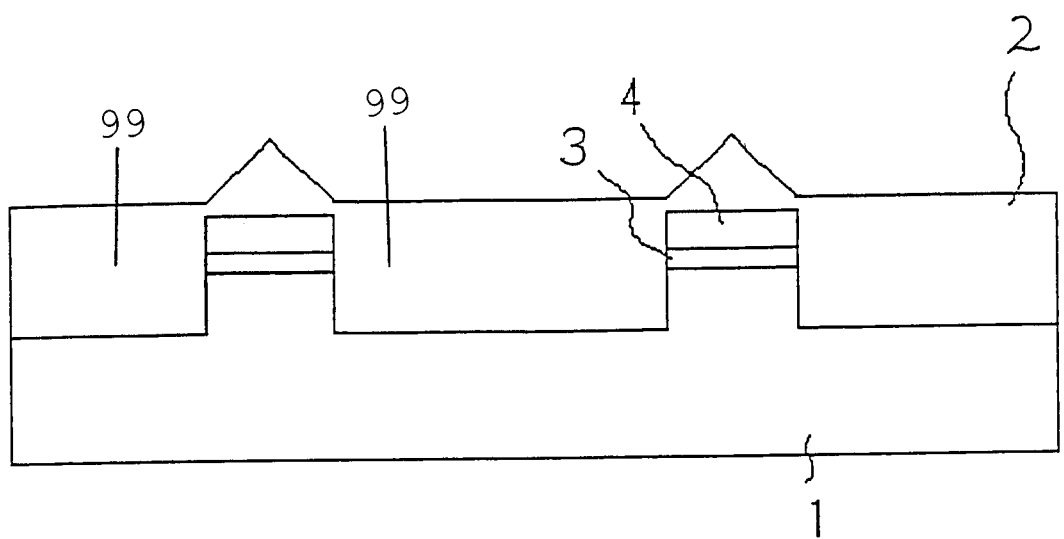
FIGS. 4A through 4G are fragmentary cross sectional elevation views illustrative of a novel method of forming a novel non-volatile semiconductor memory device having an integration of a logic transistor region and a flash cell region isolated by a shallow trench isolation, taken along an A-B line of FIG. 2, in a first embodiment in accordance with the present invention.

With reference to FIG. 4A, a PAD oxide film 3 is formed over a silicon substrate 1. A stopper nitride film 4 is deposited on the PAD oxide film 3. A resist film is applied on the stopper nitride film 4. The resist film is patterned by a lithography process to form a resist pattern. A selective isotropic etching process is carried out by use of the resist pattern as a mask to selectively etch the stopper nitride film 4 (not illustrated), the PAD oxide film 3 and the silicon substrate 1, thereby forming shallow trench isolation grooves 99. Ridged portions of the silicon substrate 1 are defined by the shallow trench isolation grooves. The ridged portions of the silicon substrate 1 underlie the laminations of the PAD oxide film 3 and the stopper nitride film 4. A shallow trench isolation burying oxide film 2 is entirely deposited so that the shallow trench isolation grooves are completely buried with the shallow trench isolation burying oxide film 2, wherein the shallow trench isolation burying oxide film 2 also extends over the stopper nitride film 4.

Figure 4B:
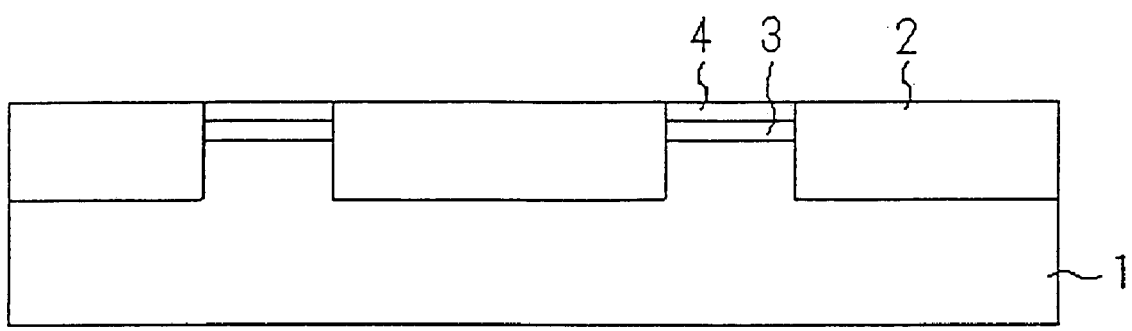

With reference to FIG. 4B, a chemical mechanical polishing process is carried out to planerize a surface of the shallow trench isolation burying oxide film 2, whereby the top surface of the stopper nitride film 4 is shown and slightly polished. As a result, a planerized surface is formed, wherein the top surface of the stopper nitride film 4 is leveled to the polished top surface of the shallow trench isolation burying oxide film 2, which completely buries the shallow trench isolation grooves.

Figure 4C:
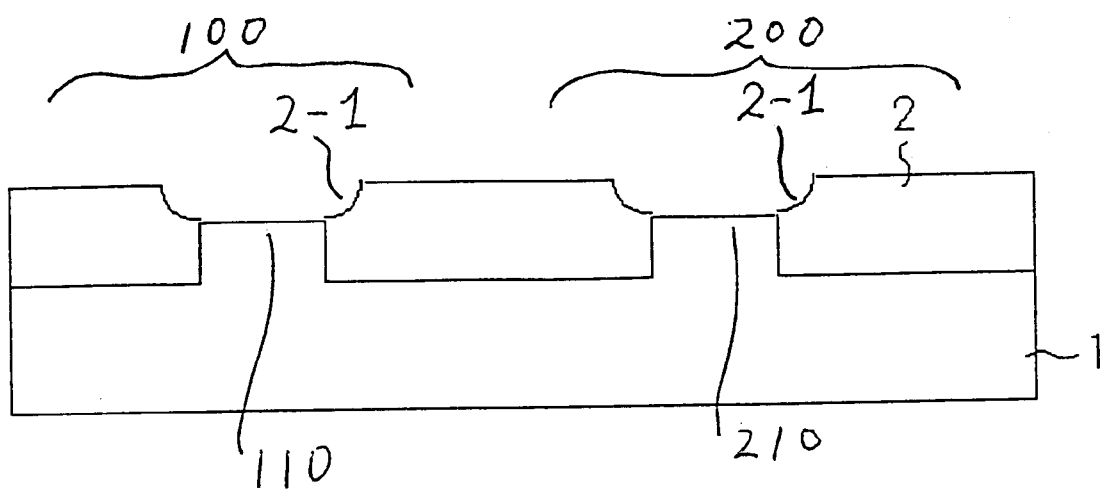

With reference to FIG. 4C, the stopper nitride film 4 and the PAD oxide film 3 are etched by a selective anisotropic etching such as a wet etching by use of an etchant, whilst the shallow trench isolation burying oxide film 2 is not etched, except for adjacent portions to the stopper nitride film 4 and the PAD oxide film 3. A time of the wet etching process is so controlled that the top surfaces of the silicon substrate 1 are shown, whilst the shallow trench isolation burying oxide film 2 is not etched, except for adjacent portions to the stopper nitride film 4 and the PAD oxide film 3, whereby etched side walls 2-1 of the shallow trench isolation burying oxide film 2 are formed in the vicinity of the top surfaces of the ridged portions of the silicon substrate 1. The ridged portions of the silicon substrate 1 are individually surrounded and defined by the shallow trench isolation 2, which fills or buries the shallow trench isolation groove. The shallow trench isolation burying oxide film 2 serves the shallow trench isolation 2. Further, device formation regions of the silicon substrate 1 are defined to be the ridged portions of the silicon substrate 1. The etched side walls 2-1 of the shallow trench isolation burying oxide film 2 are caused by a selective isotropic wet etching such as a wet etching for completely etching the laminations of the stopper nitride film 4 and the PAD oxide film 3 overlying the first and second ridged portions of the silicon substrate 1. The top surfaces of the first and second ridged portions of the silicon substrate 1 are lower in level than the top surface of the shallow trench isolation burying oxide film 2. Since the selective etching process for completely removing the laminations of the stopper nitride film 4 and the PAD oxide film 3 overlying the first and second ridged portions of the silicon substrate 1 is the isotropic etching such as the wet etching, the side walls of the shallow trench isolation burying oxide film 2 are etched. A first device formation region 110 comprising the top surface region of the first ridged portion of the silicon substrate 1 is defined in a flash cell region 100. A second device formation region 210 comprising the top surface region of the second ridged portion of the silicon substrate 1 is defined in a logic transistor region 200.

Figure 4D:
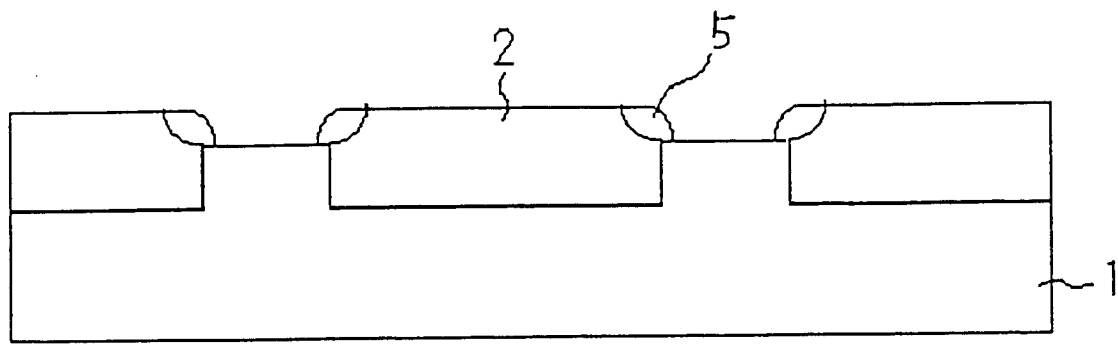

With reference to FIG. 4D, an oxide film is entirely formed by a deposition method such as a chemical vapor deposition method, so that the oxide film extends over the top surfaces of the ridged portions of the silicon substrate 1, the etched side walls 2-1 and the top portions of the shallow trench isolation burying oxide film 2. An etch-back process is carried out to the oxide film to selectively remove the oxide film from the top surfaces of the ridged portions of the silicon substrate 1 and from the top portions of the shallow trench isolation burying oxide film 2, whereby the oxide film remains only on the etched side walls 2-1 of the shallow trench isolation burying oxide film 2, wherein side wall oxide films 5 comprising the remaining oxide films are formed on the etched side walls 2-1 of the shallow trench isolation burying oxide film 2.

Figure 4E:
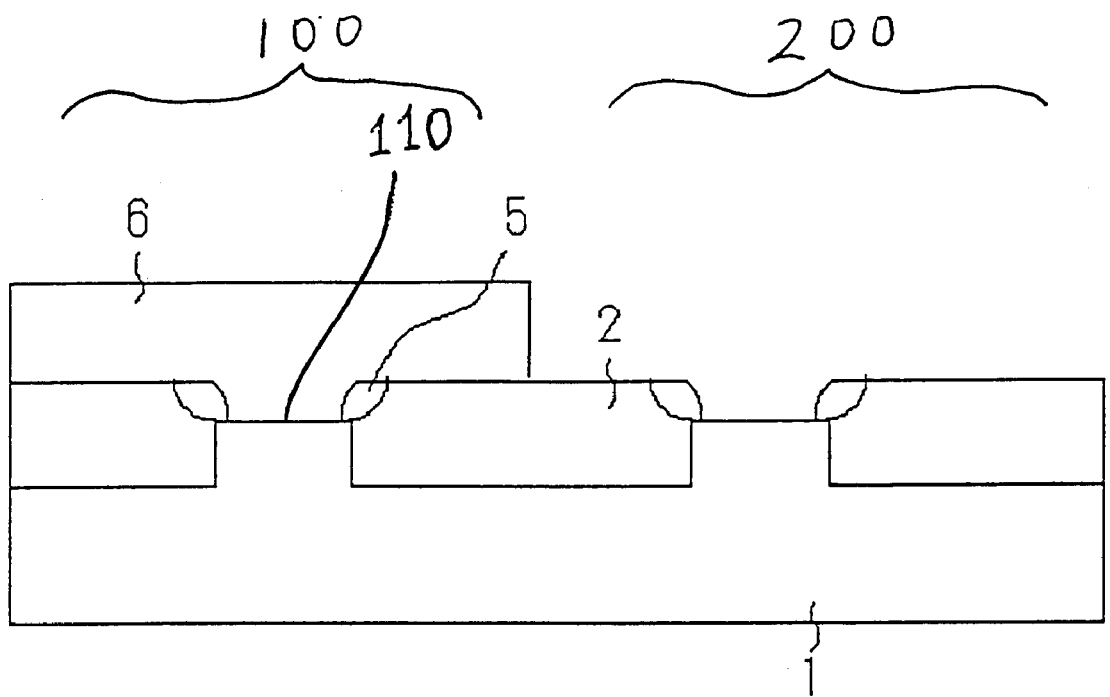

With reference to FIG. 4E, a resist film 6 is selectively formed over the shallow trench isolation burying oxide film 2, the side wall oxide films 5 and the top surface of the first ridged portion 110 of the silicon substrate 1, provided that the resist film 6 extends only in the flash cell region 100. As described above, the top surface of the shallow trench isolation burying oxide film 2 is higher in level than the top surfaces of the first and second ridged portions of the silicon substrate 1.

Figure 4F:
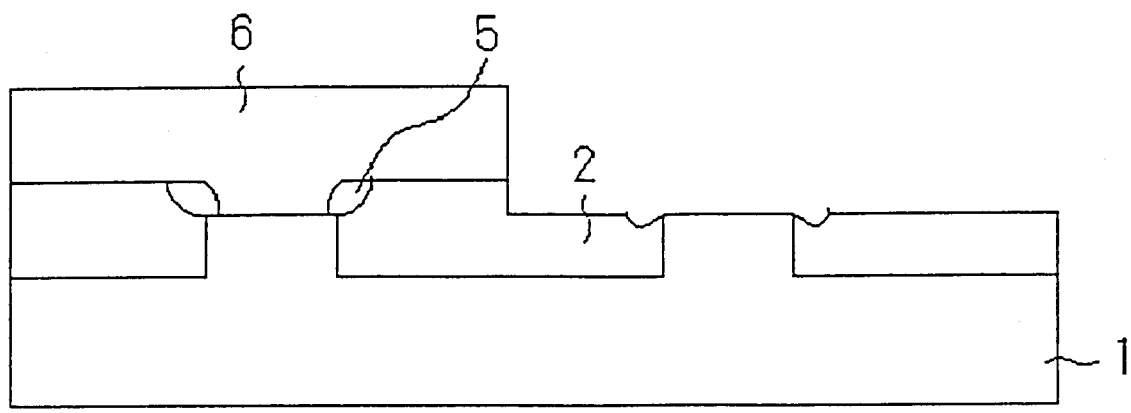

With reference to FIG. 4F, a selective etching process is carried out to the logic transistor region 200 by use of the resist film 6 as a mask, whereby the side wall oxide films 5 and the top surface of the shallow trench isolation burying oxide film 2 in the logic transistor region 200 are etched, so that the etched top surface of the shallow trench isolation burying oxide film 2 has the same level as the second device formation region 210 which comprises the top surface of the second ridged portion of the silicon substrate 1. Divots are formed in the adjacent portions of the etched top surface of the shallow trench isolation burying oxide film 2 to the second device formation region 210 comprising the top surface of the second ridged portion of the silicon substrate 1. It is necessary for forming a fine gate of a logic transistor that the etched top surface of the shallow trench isolation burying oxide film 2 has the same level as the second device formation region 210 which comprises the top surface of the second ridged portion of the silicon substrate 1 because an exact focusing in the lithography process for realizing a highly accurate patterning is obtained by a planerized surface. Since the first device formation region 110 comprising the top surface of the first ridged portion of the silicon substrate 1 has the same level as the second device formation region 210 which comprises the top surface of the second ridged portion of the silicon substrate 1, the etched top surface of the shallow trench isolation burying oxide film 2 in the logic transistor region 200 has the same level as the first and second device formation regions 110 and 210 which respectively comprise the top surfaces of the first and second ridged portions of the silicon substrate 1. A step is also formed on the surface of the shallow trench isolation burying oxide film 2 at a boundary between the flash cell region 100 and the logic transistor region 200.

Figure 4G:
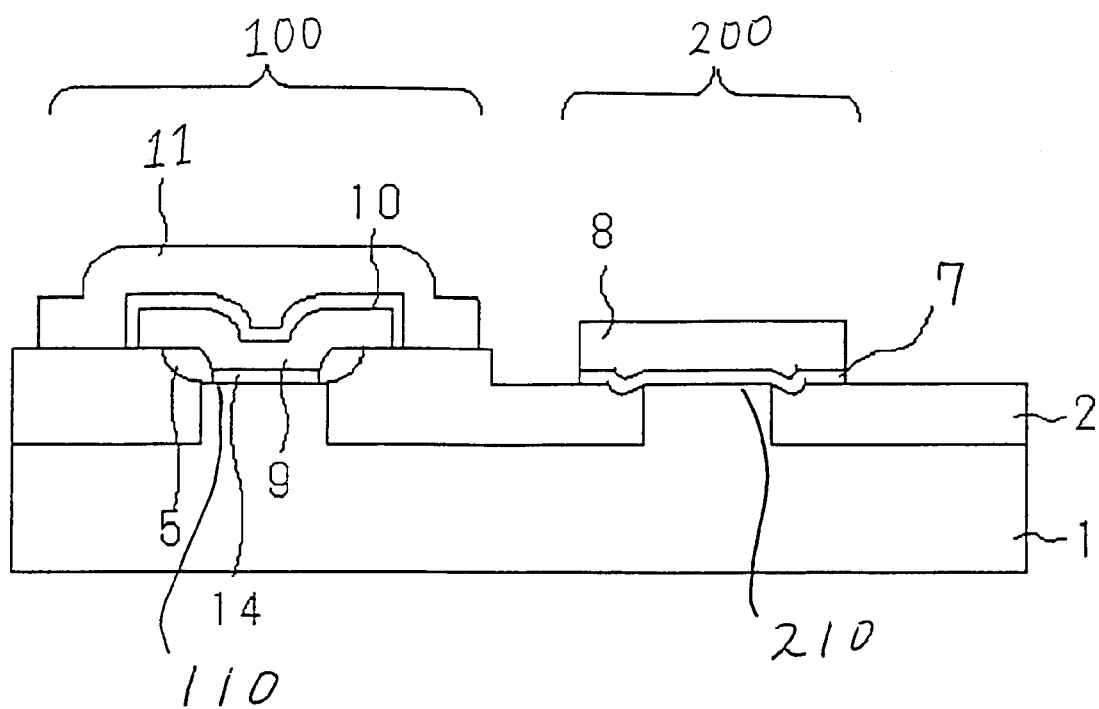

With reference to FIG. 4G, the used resist film 6 is removed. A flash cell is formed in the flash cell region 100 and further a logic transistor is formed in the logic transistor region 200. The sequence of the formations of the flash cell and the logic transistor is optional. The flash cell is formed as follows. A tunnel oxide film 14 is formed on the first device formation region 110, which comprises the top surface of the first ridged portion of the silicon substrate 1. The tunnel oxide film 14 is defined by the side wall oxide films 5. Since the first device formation region 110, which comprises the top surface of the first ridged portion of the silicon substrate 1 is free of any divot, the tunnel oxide film 14 does not extend over any divot, for which reason the tunnel oxide film 14 has a uniform thickness. A floating gate electrode 9 is selectively formed over the tunnel oxide film 14, the side wall oxide films 5 and adjacent parts of the top surface of the shallow trench isolation burying oxide film 2 to the side wall oxide films 5. A dielectric film 10 is formed on a surface of the floating gate electrode 9. A control gate electrode 11 is formed on a surface of the dielectric film 10, whereby a flash memory cell is formed in the flash cell region 100. The logic transistor is formed as follows. A gate insulation film 7 is formed over the second device formation region 210 comprising the top surface of the second ridged portion of the silicon substrate 1 and also over adjacent parts having divots of the top surface of the shallow trench isolation burying oxide film 2. A logic gate 7 is formed on the gate insulation film 7, whereby the logic transistor is formed in the logic transistor region 200.

As described above, the gate insulation film 7 of the logic transistor in the logic transistor region 200 has variations in thickness over the divots. Notwithstanding, the tunnel oxide film 14 of the flash cell in the flash cell region 100 does not extend over any divots, for which reason the tunnel oxide film 14 is uniform in thickness. The thickness of the tunnel oxide film 14 defines a width of a tunnel barrier, which further defines a threshold voltage of the flash memory. The uniformity in thickness of the tunnel oxide film 14 causes no variation in threshold voltage of the flash memory, whereby the high reliability of the flash memory is improved. Further, defects of the tunnel oxide film 14 are reduced to improve the quality of he tunnel oxide film.

Second Embodiment

Figure 5:
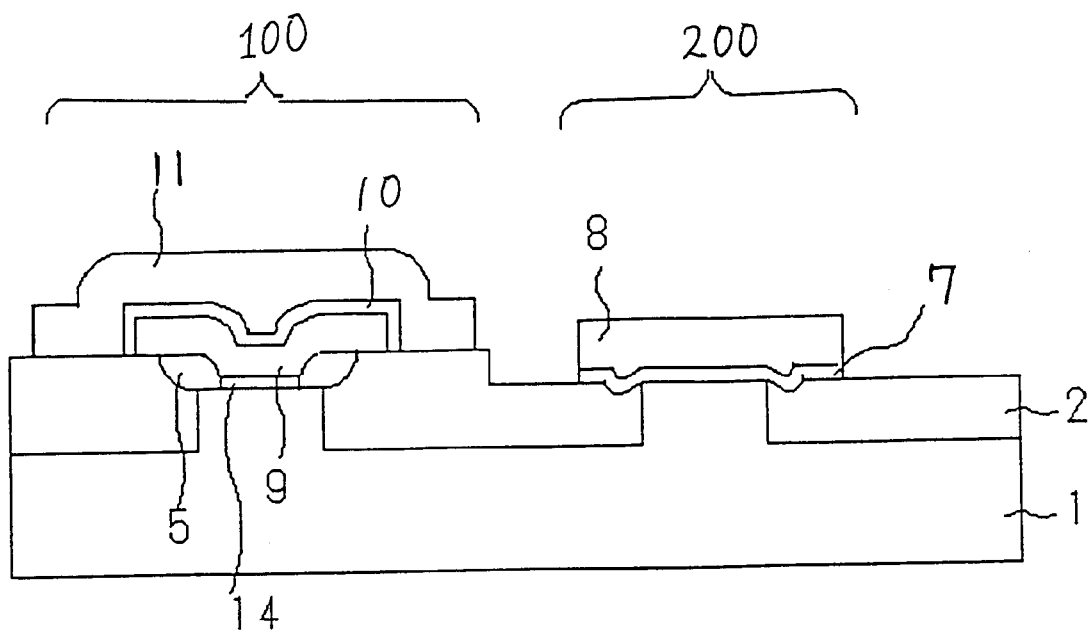
FIG. 5 is a fragmentary cross sectional elevation view illustrative of a novel non-volatile semiconductor memory device having an integration of a logic transistor region and a flash cell region isolated by a shallow trench isolation, taken along an A-B line of FIG. 2, in a second embodiment in accordance with the present invention.

A second embodiment according to the present invention will be described in detail with reference to the drawings. FIG. 5 is a fragmentary cross sectional elevation view illustrative of a novel non-volatile semiconductor memory device having an integration of a logic transistor region and a flash cell region isolated by a shallow trench isolation, taken along an A-B line of FIG. 2, in a second embodiment in accordance with the present invention.

A novel non-volatile semiconductor memory device has a flash cell region 100 and a logic transistor region 200. The novel non-volatile semiconductor memory device is formed over a silicon substrate 1. The silicon substrate 1 has a first ridged portion in the flash cell region 100 and a second ridged portion in the logic transistor region 200. The top surfaces of the first ridged portion and the second ridged portion have the same level as each other. A first device formation region 110 comprises the top surface of the first ridged portion of the silicon transistor 1. A second deice formation region 210 comprises the top surface of the second ridged portion of the silicon transistor 1. The first ridged portion and the second ridged portion are defined by shallow trench grooves, which are buried with a shallow trench isolation oxide film 2. The shallow trench isolation oxide film 2 has a first upper surface in the flash cell region 100, wherein the first upper surface is higher in level than the top surfaces of the first and second ridged portions of the silicon substrate 1. The shallow trench isolation oxide film 2 has a second upper surface in the logic transistor region 200, wherein the second upper surface is lower in level than the first upper surface in the flash cell region 100, and the second upper surface is the same in level as the top surfaces of the first and second ridged portions of the silicon substrate 1. The first and second upper surfaces of the shallow trench isolation oxide film 2 are bounded by a step at a boundary between the flash cell region 100 and the logic transistor region 200. Since the first upper surface is higher in level than the top surface of the first ridged portion of the silicon substrate 1, side walls of the shallow trench isolation oxide film 2 are formed, which extend from the to surface of the first ridged portion of the silicon substrate 1. Side wall oxide films 5 are selectively provided on the side walls of the shallow trench isolation oxide film 2 adjacent to the first device formation region comprising the top surface of the first ridged portion of the silicon substrate 1. A tunnel oxide film 14 is provided on the first device formation region 110 comprising the top surface of the first ridged portion of the silicon substrate 1. The tunnel oxide film 14 is defined by the side wall oxide films 5. Since the tunnel oxide film 14 selectively extends over only the first device formation region 110 free of any divot, for which reason the tunnel oxide film 14 has a uniform thickness. A floating gate electrode 9 is selectively provided over the tunnel oxide film 14, the side wall oxide films 5 and adjacent parts of the top surface of the shallow trench isolation burying oxide film 2 to the side wall oxide films 5. A dielectric film 10 is provided on a surface of the floating gate electrode 9. A control gate electrode 11 is provided on a surface of the dielectric film 10. A flash memory cell is formed in the flash cell region 100. A gate insulation film 7 is provided over the second device formation region 210 comprising the top surface of the second ridged portion of the silicon substrate 1 and also over adjacent parts having divots of the top surface of the shallow trench isolation burying oxide film 2. A logic gate 7 is provided on the gate insulation film 7. The logic transistor is provided in the logic transistor region 200.

As described above, the gate insulation film 7 of the logic transistor in the logic transistor region 200 has variations in thickness over the divots. Notwithstanding, the tunnel oxide film 14 of the flash cell in the flash cell region 100 does not extend over any divots, for which reason the tunnel oxide film 14 is uniform in thickness. The thickness of the tunnel oxide film 14 defines a width of a tunnel barrier, which further defines a threshold voltage of the flash memory. The uniformity in thickness of the tunnel oxide film 14 causes no variation in threshold voltage of the flash memory, whereby the high reliability of the flash memory is improved.

FIGS. 6A through 6H are fragmentary cross sectional elevation views illustrative of a novel method of forming a novel non-volatile semiconductor memory device having an integration of a logic transistor region and a flash cell region isolated by a shallow trench isolation, taken along an A-B line of FIG. 2, in a second embodiment in accordance with the present invention.

Figure 6A:
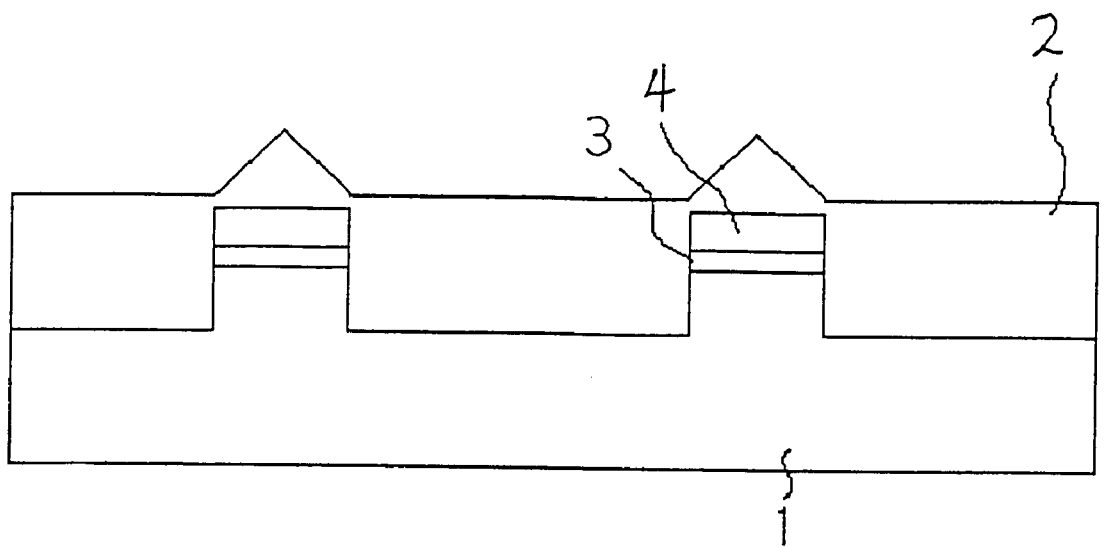
FIGS. 6A through 6H are fragmentary cross sectional elevation views illustrative of a novel method of forming a novel non-volatile semiconductor memory device having an integration of a logic transistor region and a flash cell region isolated by a shallow trench isolation, taken along an A-B line of FIG. 2, in a second embodiment in accordance with the present invention.

With reference to FIG. 6A, a PAD oxide film 3 is formed over a silicon substrate 1. A stopper nitride film 4 is deposited on the PAD oxide film 3. A resist film is applied on the stopper nitride film 4. The resist film is patterned by a lithography process to form a resist pattern. A selective isotropic etching process is carried out by use of the resist pattern as a mask to selectively etch the stopper nitride film 4, the PAD oxide film 3 and the silicon substrate 1, thereby forming shallow trench isolation grooves. Ridged portions of the silicon substrate 1 are defined by the shallow trench isolation grooves. The ridged portions of the silicon substrate 1 underlie the laminations of the PAD oxide film 3 and the stopper nitride film 4. The used resist pattern is removed. A shallow trench isolation burying oxide film 2 is entirely deposited so that the shallow trench isolation grooves are completely buried with the shallow trench isolation burying oxide film 2, wherein the shallow trench isolation burying oxide film 2 also extends over the stopper nitride film 4.

Figure 6B:
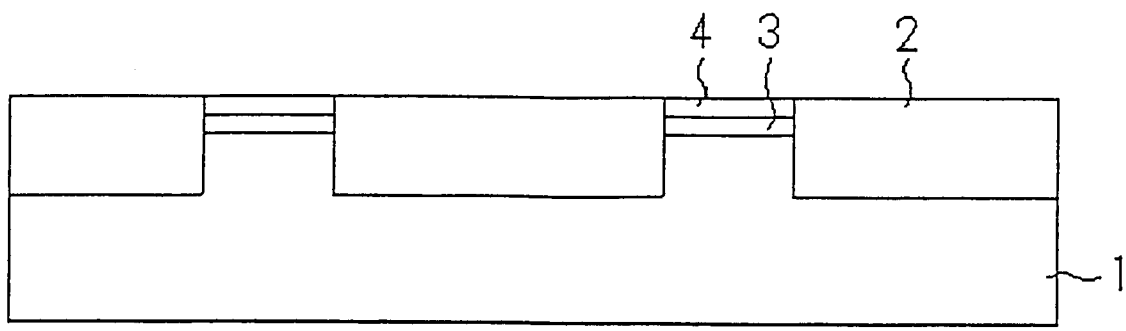

With reference to FIG. 6B, a chemical mechanical polishing process is carried out to planerize a surface of the shallow trench isolation burying oxide film 2, whereby the top surface of the stopper nitride film 4 is shown and slightly polished. As a result, a planerized surface is formed, wherein the top surface of the stopper nitride film 4 is leveled to the polished top surface of the shallow trench isolation burying oxide film 2, which completely buries the shallow trench isolation grooves.

Figure 6C:
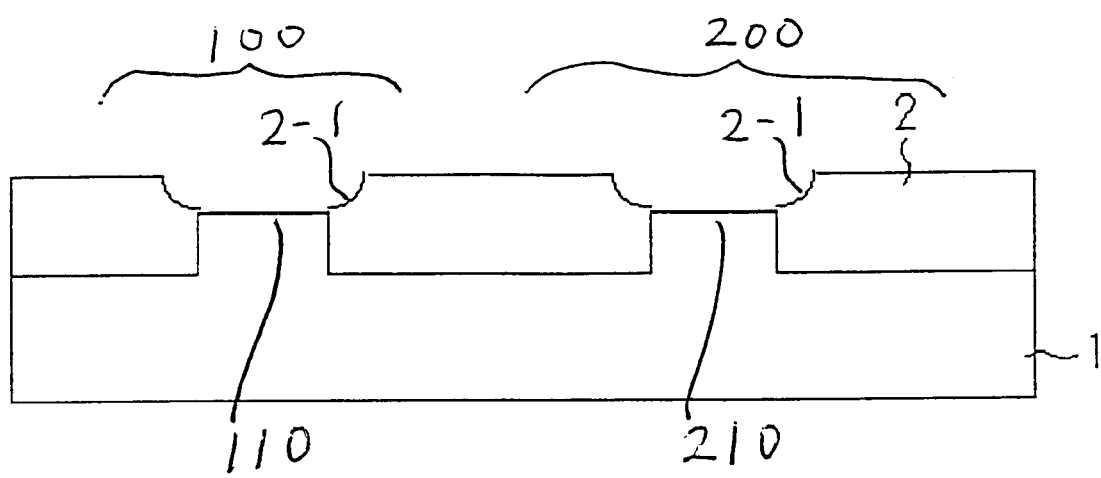

With reference to FIG. 6C, the stopper nitride film 4 and the PAD oxide film 3 are etched by a selective anisotropic etching such as a wet etching by use of an etchant, whilst the shallow trench isolation burying oxide film 2 is not etched, except for adjacent portions to the stopper nitride film 4 and the PAD oxide film 3. A time of the wet etching process is so controlled that the top surfaces of the silicon substrate 1 are shown, whilst the shallow trench isolation burying oxide film 2 is not etched, except for adjacent portions to the stopper nitride film 4 and the PAD oxide film 3, whereby etched side walls 2-1 of the shallow trench isolation burying oxide film 2 are formed in the vicinity of the top surfaces of the ridged portions of the silicon substrate 1. The ridged portions of the silicon substrate 1 are individually surrounded and defined by the shallow trench isolation 2, which fills or buries the shallow trench isolation groove. The shallow trench isolation burying oxide film 2 serves the shallow trench isolation 2. Further, device formation regions of the silicon substrate 1 are defined to be the ridged portions of the silicon substrate 1. The etched side walls 2-1 of the shallow trench isolation burying oxide film 2 are caused by a selective isotropic wet etching such as a wet etching for completely etching the laminations of the stopper nitride film 4 and the PAD oxide film 3 overlying the first and second ridged portions of the silicon substrate 1. The top surfaces of the first and second ridged portions of the silicon substrate 1 are lower in level than the top surface of the shallow trench isolation burying oxide film 2. Since the selective etching process for completely removing the laminations of the stopper nitride film 4 and the PAD oxide film 3 overlying the first and second ridged portions of the silicon substrate 1 is the isotropic etching such as the wet etching, the side walls of the shallow trench isolation burying oxide film 2 are etched. A first device formation region 110 comprising the top surface region of the first ridged portion of the silicon substrate 1 is defined in a flash cell region 100. A second device formation region 210 comprising the top surface region of the second ridged portion of the silicon substrate 1 is defined in a logic transistor region 200.

Figure 6D:
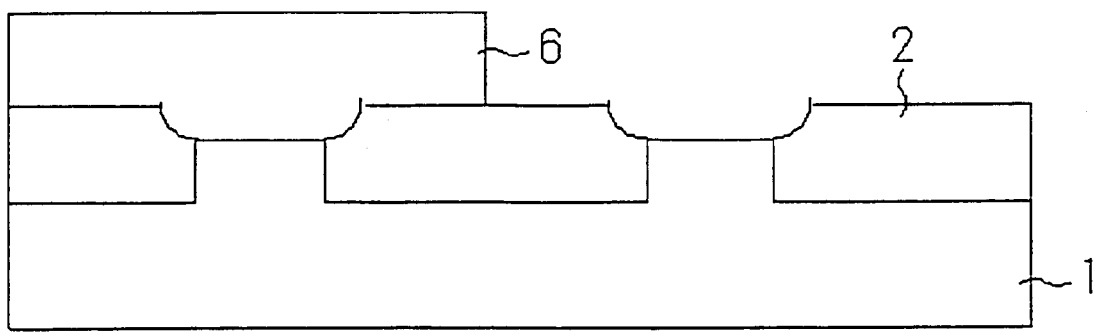

With reference to FIG. 6D, a resist film 6 is selectively formed over the top surface and the etched side walls of the shallow trench isolation burying oxide film 2 and the top surface of the first ridged portion 110 of the silicon substrate 1, provided that the resist film 6 extends only in the flash cell region 100. As described above, the top surface of the shallow trench isolation burying oxide film 2 is higher in level than the top surfaces of the first and second ridged portions of the silicon substrate 1.

Figure 6E:
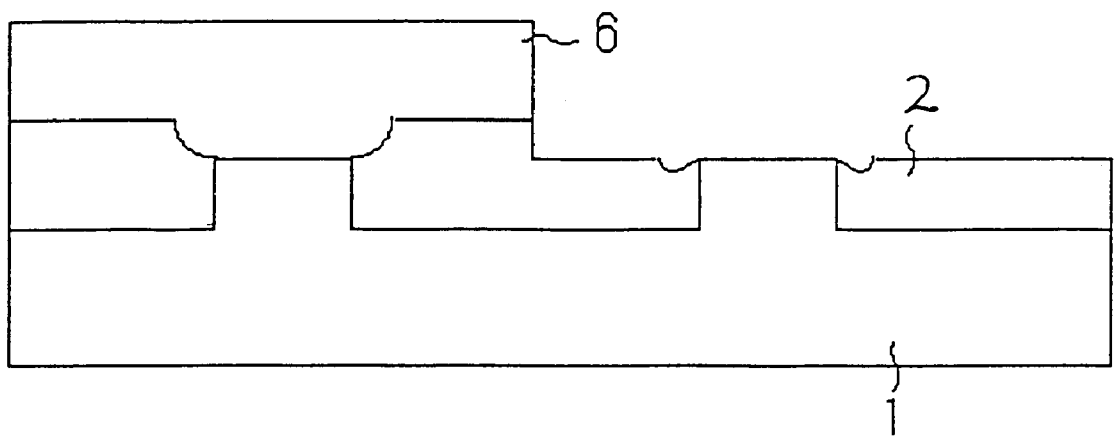

With reference to FIG. 6E, a selective etching process is carried out to the logic transistor region 200 by use of the resist film 6 as a mask, whereby the top surface of the shallow trench isolation burying oxide film 2 in the logic transistor region 200 is etched, so that the etched top surface of the shallow trench isolation burying oxide film 2 has the same level as the second device formation region 210 which comprises the top surface of the second ridged portion of the silicon substrate 1. Divots are formed in the adjacent portions of the etched top surface of the shallow trench isolation burying oxide film 2 to the second device formation region 210 comprising the top surface of the second ridged portion of the silicon substrate 1. It is necessary for forming a fine gate of a logic transistor that the etched top surface of the shallow trench isolation burying oxide film 2 has the same level as the second device formation region 210 which comprises the top surface of the second ridged portion of the silicon substrate 1 because an exact focusing in the lithography process for realizing a highly accurate patterning is obtained by a planerized surface. Since the first device formation region 110 comprising the top surface of the first ridged portion of the silicon substrate 1 has the same level as the second device formation region 210 which comprises the top surface of the second ridged portion of the silicon substrate 1, the etched top surface of the shallow trench isolation burying oxide film 2 in the logic transistor region 200 has the same level as the first and second device formation regions 110 and 210 which respectively comprise the top surfaces of the first and second ridged portions of the silicon substrate 1. A step is also formed on the surface of the shallow trench isolation burying oxide film 2 at a boundary between the flash cell region 100 and the logic transistor region 200. The used resist film is removed.

Figure 6F:
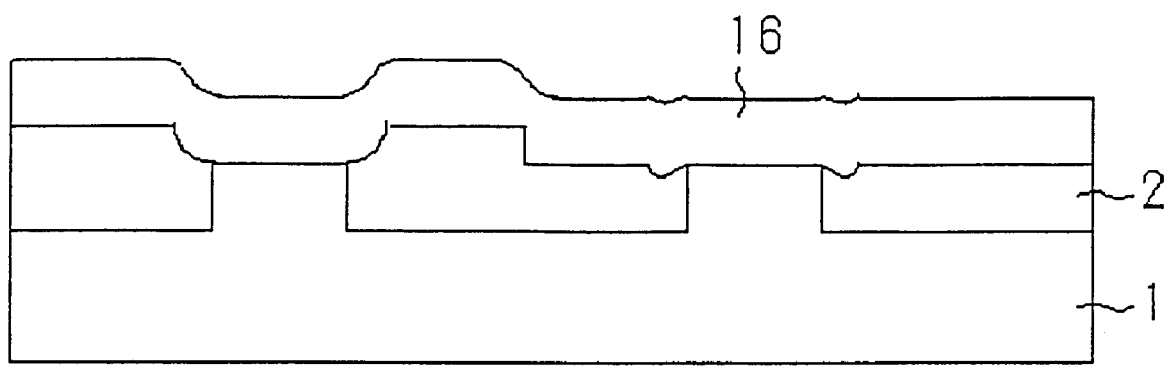

With reference to FIG. 6F, an oxide film 16 is entirely formed by a deposition method such as a chemical vapor deposition method, so that the oxide film 16 extends over the top surfaces of the first and second ridged portions of the silicon substrate 1, the etched side walls 2-1 and the upper surfaces of the shallow trench isolation burying oxide film 2 as well as over the divots, wherein the oxide film 16 extends over the flash cell region 100 and the logic transistor region 200.

Figure 6G:
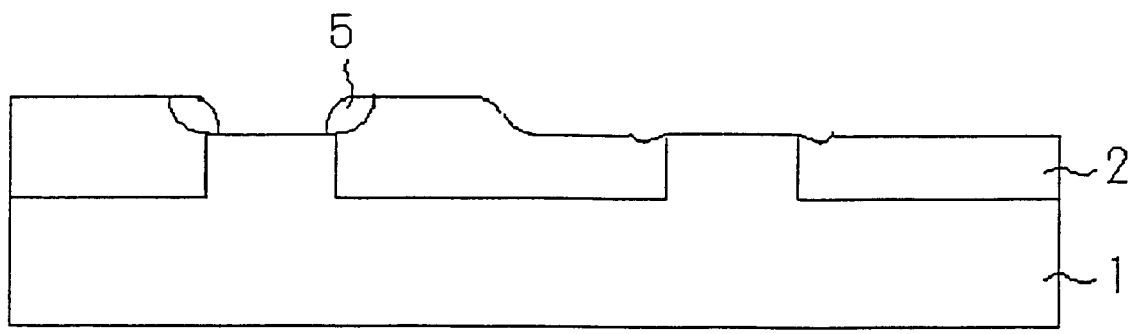

With reference to FIG. 6G, an etch-back process is carried out to the oxide film 16 to selectively remove the oxide film from the top surfaces of the first and second ridged portions of the silicon substrate 1 and from the upper portions of the shallow trench isolation burying oxide film 2 and the divots, whereby the oxide film 16 remains only on the etched side walls 2-1 of the shallow trench isolation burying oxide film 2, wherein side wall oxide films 5 comprising the remaining oxide films 16 are formed on the etched side walls 2-1 of the shallow trench isolation burying oxide film 2. The divots are incompletely planerized by the etch-back process.

Figure 6H:
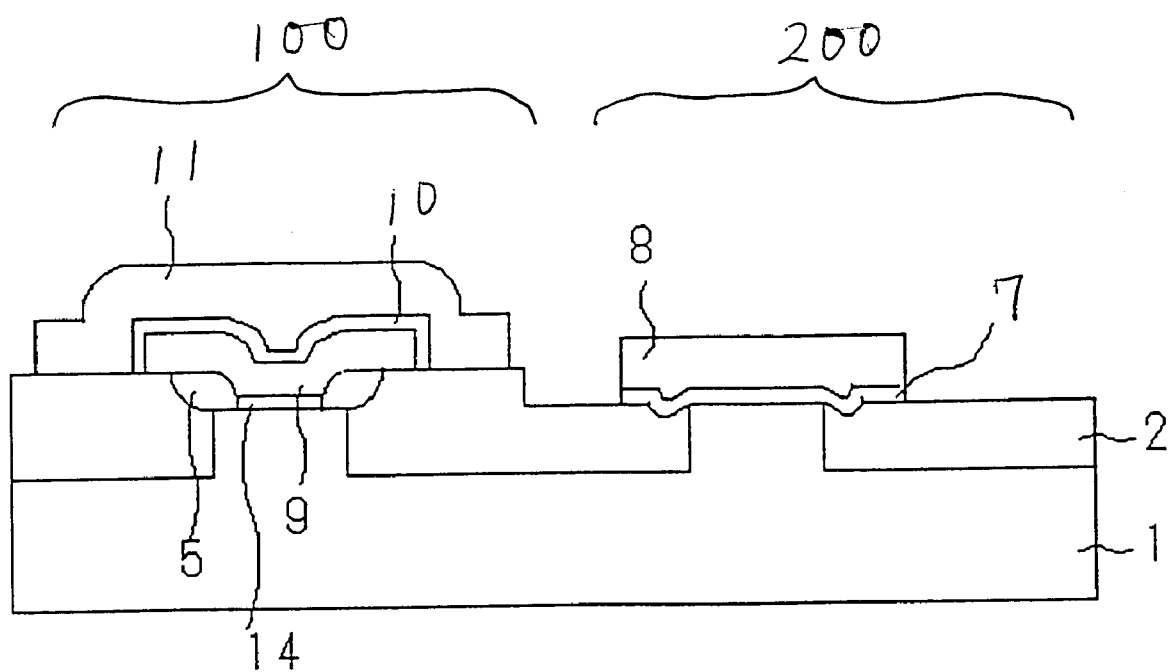

With reference to FIG. 6H, a flash cell is formed in the flash cell region 100 and further a logic transistor is formed in the logic transistor region 200. The sequence of the formations of the flash cell and the logic transistor is optional. The flash cell is formed as follows. A tunnel oxide film 14 is formed on the first device formation region 110, which comprises the top surface of the first ridged portion of the silicon substrate 1. The tunnel oxide film 14 is defined by the side wall oxide films 5. Since the first device formation region 110, which comprises the top surface of the first ridged portion of the silicon substrate 1 is free of any divot, the tunnel oxide film 14 does not extend over any divot, for which reason the tunnel oxide film 14 has a uniform thickness. A floating gate electrode 9 is selectively formed over the tunnel oxide film 14, the side wall oxide films 5 and adjacent parts of the top surface of the shallow trench isolation burying oxide film 2 to the side wall oxide films 5. A dielectric film 10 is formed on a surface of the floating gate electrode 9. A control gate electrode 11 is formed on a surface of the dielectric film 10, whereby a flash memory cell is formed in the flash cell region 100. The logic transistor is formed as follows. A gate insulation film 7 is formed over the second device formation region 210 comprising the top surface of the second ridged portion of the silicon substrate 1 and also over adjacent parts having divots of the top surface of the shallow trench isolation burying oxide film 2. A logic gate 7 is formed on the gate insulation film 7, whereby the logic transistor is formed in the logic transistor region 200.

As described above, the gate insulation film 7 of the logic transistor in the logic transistor region 200 has variations in thickness over the divots. Notwithstanding, the tunnel oxide film 14 of the flash cell in the flash cell region 100 does not extend over any divots, for which reason the tunnel oxide film 14 is uniform in thickness. The thickness of the tunnel oxide film 14 defines a width of a tunnel barrier, which further defines a threshold voltage of the flash memory. The uniformity in thickness of the tunnel oxide film 14 causes no variation in threshold voltage of the flash memory, whereby the high reliability of the flash memory is improved. Further, defects of the tunnel oxide film 14 are reduced to improve the quality of he tunnel oxide film. Furthermore, the divots are also incompletely planerized, for which reason the shape of the logic gate 8 is also improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications, which fall within the spirit and scope of the present invention.

What is claimed is:

1. A non-volatile semiconductor memory cell including a tunnel barrier structure comprising:

a first semiconductor ridged portion having a first top surface, said first semiconductor ridged portion being defined by a groove;

an insulating layer burying the groove, the insulating layer having a first upper surface which is higher in level than the first top surface of the first semiconductor ridged portion, the insulating layer having side walls extending upwardly from edges of the first top surface of the first semiconductor ridged portion;

side wall insulating films provided on the side walls; and a tunnel insulating film provided on the first top surface of the first semiconductor ridged portion, the tunnel insulating film being defined by the side wall insulating films.

2. The non-volatile semiconductor memory cell as claimed in claim 1, wherein the tunnel insulating film comprises an oxide film.

3. The non-volatile semiconductor memory cell as claimed in claim 1, wherein the groove comprises a shallow trench groove, and the insulating layer burying the shallow trench groove forms a shallow trench isolation structure.

4. The non-volatile semiconductor memory cell as claimed in claim 1, wherein the side walls are isotropically etched.

5. A non-volatile semiconductor memory cell structure comprising:

a semiconductor substrate having a first semiconductor ridged portion having a first top surface, said first semiconductor ridged portion being defined by a groove formed in the semiconductor substrate;

an insulating layer burying the groove, the insulating layer having a first upper surface which is higher in level than the first top surface of the first semiconductor ridged portion, and the insulating layer having side walls extending upwardly from edges of the first top surface of the first semiconductor ridged portion;

side wall insulating films provided on the side walls;

a tunnel insulating film provided on the first top surface of the first semiconductor ridged portion, and the tunnel insulating film being defined by the side wall insulating films;

a floating gate electrode extending over the tunnel insulating film and the side wall insulating films;

a dielectric film extending on a surface of the floating gate electrode; and a control gate electrode provided on the dielectric film.

6. The non-volatile semiconductor memory cell structure as claimed in claim 5, wherein the tunnel insulating film comprises an oxide film.

7. The non-volatile semiconductor memory cell structure as claimed in claim 5, wherein the groove comprises a shallow trench groove, and the insulating layer burying the shallow trench groove forms a shallow isolation structure.

8. The non-volatile semiconductor memory cell structure as claimed in claim 5, wherein the side walls are isotropically etched side walls.

9. A non-volatile semiconductor memory device having an integration of a non-volatile memory cell region and a logic transistor region, the non-volatile semiconductor memory device comprising:

a semiconductor substrate having a first semiconductor ridged portion having a first top surface in the non-volatile memory cell region, said first semiconductor ridged portion being defined by a groove formed in the semiconductor substrate, and the semiconductor substrate having a second semiconductor ridged portion having a second top surface in the logic transistor region, and the first and second top surfaces of the first and second semiconductor ridged portions being equal in level;

an insulating layer burying the groove, the insulating layer having a first upper surface in the non-volatile memory cell region, and the first upper surface being higher in level than the first and second top surfaces of the first and second semiconductor ridged portions, and the insulating layer in the non-volatile memory cell region having side walls extending upwardly from edges or the first top surface of the first semiconductor ridged portion, the insulating layer having a second upper surface in the logic transistor region, the second upper surface being equal in level to the first and second top surfaces of the first and second semiconductor ridged portions and also being lower in level than the first upper surface;

side wall insulating films provided on the side walls in the non-volatile memory cell region;

a tunnel insulating film provided on the first top surface of the first semiconductor ridged portion, the tunnel insulating film being defined by the side wall insulating films;

a floating gate electrode extending over the tunnel insulating film and the side wall insulating films;

a dielectric film extending on a surface of the floating gate electrode;

a control gate electrode provided on the dielectric film;

a gate insulating film provided on the second top surface of the second semiconductor ridged portion; and a logic gate electrode provided on the gate insulating film.

10. The non-volatile semiconductor memory device as claimed in claim 9, wherein the first and second upper surfaces being bounded by a step at a boundary between the non-volatile memory cell region and the logic transistor region.

11. The non-volatile semiconductor memory device as claimed in claim 9, wherein the tunnel insulating film comprises an oxide film.

12. The non-volatile semiconductor memory device as claimed in claim 9, wherein the groove comprises a shallow trench groove, and the insulating layer burying the shallow trench groove forms a shallow isolation structure.

13. The non-volatile semiconductor memory device as claimed in claim 9, wherein the side walls are isotropically etched.

* * * * *